US006117774A

United States Patent [19]

Nikaido et al.

[11] Patent Number: 6,117,774

[45] Date of Patent: *Sep. 12, 2000

[54] METHOD FOR MANUFACTURING SHADOW MASK AND ETCHING-RESISTANT LAYER-COATING APPARATUS

[75] Inventors: Masaru Nikaido; Yasuhisa Ohtake; Sachiko Hirahara, all of Fukaya, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/943,939

[22] Filed: Sep. 30, 1997

[30] Foreign Application Priority Data

Sep. 30, 1996 [JP] Japan .................................... 8-259538

[51] Int. Cl.[7] ............................ H01L 21/302; B44C 1/22

[52] U.S. Cl. .......................... 438/689; 438/694; 438/944; 216/12

[58] Field of Search ............................. 216/12; 437/35.7, 437/360, 434.2; 438/689, 694, 944

[56] References Cited

U.S. PATENT DOCUMENTS

| | | | |
|---|---|---|---|
| 4,791,881 | 12/1988 | Iwasaki | 118/244 |
| 4,861,422 | 8/1989 | Kudou et al. | 216/12 |

FOREIGN PATENT DOCUMENTS

| | | | |
|---|---|---|---|
| 291929 | 11/1988 | European Pat. Off. | G03F 7/26 |
| 314110 | 5/1989 | European Pat. Off. | H01J 9/14 |
| 482612 | 4/1992 | European Pat. Off. | B05C 1/08 |
| 62-43675 | 3/1987 | Japan | B05C 1/08 |
| 2-119977 | 5/1990 | Japan | B05D 1/28 |
| 6-226175 | 8/1994 | Japan | B05C 1/08 |
| 8-111174 | 4/1996 | Japan | H01J 9/14 |

OTHER PUBLICATIONS

Patent Abstracts of Japan, vol. 095, No. 002, Mar. 1995, re JP 06 310031A.

*Primary Examiner*—Benjamin L. Utech
*Assistant Examiner*—Lynette T. Umez-Eronini
*Attorney, Agent, or Firm*—Pillsbury Madison & Sutro LLP

[57] ABSTRACT

A method of manufacturing a shadow mask by making use of a coating apparatus, wherein a gravure roll 20 mm to 60 mm in diameter is disposed below a metallic thin plate and any supporting member is not disposed at an opposite side portion of the metallic thin plate to be contacted with the gravure roll. An etching resistant liquid is fed onto the gravure roll being rotated in a direction opposite to that of the metallic thin plate and at a peripheral speed of 4 to 25 times as high as that of a feeding speed of the metallic thin plate, and an excessive portion of the etching resistant liquid is wiped away by the doctor blade before the etching resistant liquid is transferred to the metallic thin plate thereby to form an etching resistant layer on the metallic thin plate.

9 Claims, 3 Drawing Sheets

METHOD FOR MANUFACTURING SHADOW MASK AND ETCHING-RESISTANT LAYER-COATING APPARATUS

BACKGROUND OF THE INVENTION

This invention relates to a method for manufacturing a shadow mask for a color picture tube, and in particular to a so-called two-step etching method.

This invention relates also to a coating apparatus for coating an etching resistant layer to be employed in the two-step etching method.

In recent years, increasingly higher definition and quality are demanded of a color picture tube for displaying characters, graphics, etc. To meet these demands, the aperture size of a shadow mask is now increasingly made smaller and the non-uniformity of aperture size of a shadow mask is also increasingly minimized.

The shadow mask can be classified generally into two kinds, i.e. a dot type shadow mask having circular apertures and a slit type shadow mask having rectangular apertures. In the case of a color display tube designed mainly for displaying characters and graphics, the dot type shadow mask is employed. While, in the case of a color picture tube designed for use in home, the slit type shadow mask is mainly employed.

The formation of apertures of a shadow mask has been conventionally performed by means of photoetching method. In the case of a shadow mask for a color display tube where high definition and high quality are demanded in particular, a two-step etching method is adopted.

In this two-step etching method, first of all, concave portions conforming to small holes facing the electron gun are formed by means of etching on one surface of a metallic thin plate. Then, an etching resistant layer is formed on the surface where aforementioned concaves conforming to small hales are formed. Thereafter, the other surface of the metallic thin plate is etched through a pattern which conforms to large holes, thereby forming through holes, each passing from a large hole side to the aforementioned concave conforming to a small hole. In this case, the diameter of each hole can be deemed to be substantially controlled by the diameter of the small hole side.

In the case of double etching method where small holes and large holes are simultaneously etched from both sides, it is difficult not only to control a side etching phenomenon which causes the etched hole size to become larger than the opening dimension of a resist, but also to precisely control the hole size since the etching of small hole proceeds even after the small hole and the large hole are communicated with each other. Whereas, in the case of the two-step etching method, the concaves of small hole side are filled with an etching resistant layer so as to prevent the small hole from being etched again in the second etching step. Therefore, the precise dimension of small hole pattern which has been formed in the first etching step can be maintained, thus making it possible to form apertures in a metal thin plate, each aperture having a diameter which is smaller the thickness of the metal thin plate.

As for the method of coating an etching resistant layer in the two-step etching method, a spray coater, a roll coater, a gravure coater or a PDN (pipe doctor nozzle) coater has been conventionally employed in the coating method. However, since apertures of much smaller size is now required to be formed in a metal thin plate in order to meet recent demand to obtain a higher definition of a display tube, these conventional methods are no more appropriate to cope with such a recent demand. For example, when an etching resistant layer is coated over hole of very small size, air bubbles tend to remain in the concaves of the small hole side, thus making the etching resistant layer defective. Therefore, if the second etching step is performed with this defective etching resistant layer, the etching of the small hole is more likely to be proceeded in the second etching step. This side etching phenomenon may become a cause of an enlargement or deformation of hole shape, of a defective hole size, of non-uniform hole size, or of the non-uniformity in quality.

Recently, an much higher definition is also demanded in a color picture tube for use in multimedia where the aperture shape is rectangular. Therefore, the aforementioned two-step etching method is also applied now to the manufacture of a shadow mask for such a color picture tube. However, in the case of rectangular apertures, the anisotropy in shape of the small hole is more prominent as compared with that of the circular apertures, and at the same time, the depth of the small hole is relatively large, so that it has been very difficult to appropriately form the etching resistant layer on the surface of a metallic thin plate where the smaller aperture are formed.

BRIEF SUMMARY OF THE INVENTION

Therefore, an object of this invention is to provide a method of manufacturing a shadow mask, which is capable of preventing air bubble from being left remained in the concaves on the small hole side when an etching resistant layer is coated over the concaves, thereby preventing a generation of defective portion in the etching resistant layer and hence making it possible to manufacture a shadow mask which is free from non-uniformity in aperture shape and aperture size, and is excellent in uniformity of apertures.

Furthermore, another object of this invention is to provide an etching resistant layer-coating apparatus, which is capable of preventing air bubble from being left remained in the concaves on the small hole side when an etching resistant layer is coated over the concaves, thereby making it possible to form an etching resistant layer which is excellent uniformity and free from defect.

Namely, according to a first aspect of the present invention, there is provided a method of manufacturing a shadow mask, the method comprising the steps of;

- feeding in substantially horizontal direction a strip-like metallic thin plate having a first main surface and a second main surface in such a manner that the first main surface faces downward, the first main surface being etched in advance forming a plurality of concaves thereon, and the second main surface being formed in advance with a resist layer having a plurality of openings;
- coating an etching resistant liquid on the first main surface, while filling the concaves with the etching resistant liquid, by making use of an etching resistant layer-coating apparatus which is disposed beneath the first main surface of the metallic thin plate, thereby to form an etching resistant layer on the first main surface; the etching resistant layer-coating apparatus being provided with a gravure roll 20 mm to 60 mm in diameter, a member for feeding an etching resistant liquid onto the gravure roll, and a doctor blade which is disposed over the gravure roll; wherein the coating of the etching resistant liquid on the first main surface is performed by contacting a portion of the first main surface with a surface of the gravure roll carrying the etching resistant liquid, an excessive of which being wiped away in advance by means of the doctor blade, while a portion of the second main surface which is located opposite to the contacting portion of first main surface is left free, and under conditions that the gravure roll is rotated in a direction opposite to that of the metallic thin plate and at a peripheral speed of 4 to 25 times as high as that of a feeding speed of the metallic thin plate; and etching the second main surface to form through holes, each passing from the second main surface to the concave formed on the first main surface.

According to a second aspect of the present invention, there is also provided a method of manufacturing a shadow mask, the method comprising the steps of;

preparing a strip-like metallic thin plate having a first main surface etched in advance forming a plurality of concaves thereon and a second main surface formed in advance with a resist layer having a plurality of openings;

applying in advance an etching resistant liquid to the first main surface by means of a first etching resistant layer-coating apparatus;

feeding in substantially horizontal direction the metallic thin plate in such a manner that the first main surface faces downward;

coating an etching resistant liquid on the first main surface, while filling the concaves with the etching resistant liquid, by making use of a second etching resistant layer-coating apparatus which is disposed beneath the first main surface of the metallic thin plate, thereby to form an etching resistant layer on the first main surface while controlling a thickness of an etching resistant layer formed advance by the first etching resistant layer-coating apparatus; the second etching resistant layer-coating apparatus being provided with a gravure roll 20 mm to 60 mm in diameter, a member for feeding an etching resistant liquid onto the gravure roll, and a doctor blade which is disposed over the gravure roll; wherein the coating of the etching resistant liquid on the first main surface is performed by contacting a portion of the first main surface with a surface of the gravure roll carrying the etching resistant liquid after an excessive of the etching resistant liquid is wiped away by means of the doctor blade, while a portion of the second main surface which is located opposite to the contacting portion of first main surface is left free, and under conditions that the gravure roll is rotated in a direction opposite to that of the metallic thin plate and at a peripheral speed of 4 to 25 times as high as that of a feeding speed of the metallic thin plate; and etching the second main surface to form through holes, each passing from the second main surface to the concave formed on the first main surface.

The step of applying in advance an etching resistant liquid to the first main surface by means of a first etching resistant layer-coating apparatus may be carried out as follows.

A first preferable process is the same as that of the aforementioned first aspect of the invention.

Namely, the process comprises the steps of;

feeding in substantially horizontal direction a strip-like metallic thin plate having a first main surface and a second main surface in such a manner that the first main surface faces downward, the first main surface being etched in advance forming a plurality of concaves thereon, and the second main surface being deposited in advance with a resist layer having a plurality of openings; and coating an etching resistant liquid on the first main surface by making use of an etching resistant layer-coating apparatus which is disposed beneath the first main surface of the metallic thin plate, thereby to form an etching resistant layer on the first main surface; the etching resistant layer-coating apparatus being provided with a gravure roll 20 mm to 60 mm in diameter, a member for feeding an etching resistant liquid onto the gravure roll, and a doctor blade which is disposed over the gravure roll; wherein the coating of the etching resistant liquid on the first main surface is performed by contacting a portion of the first main surface with a surface of the gravure roll carrying the etching resistant liquid, an excessive of which being wiped away in advance by means of the doctor blade, while a portion of the second main surface which is located opposite to the contacting portion of first main surface is left free, and under conditions that the gravure roll is rotated in a direction opposite to that of the metallic thin plate and at a peripheral speed of 4 to 25 times as high as that of a feeding speed of the metallic thin plate.

A second preferable process is the same as that of the aforementioned first preferable process except that the peripheral speed of the gravure roll is controlled to less than 4 times as high as that of the feeding speed of the metallic thin plate.

A third preferable process is the same as that of the aforementioned first preferable process except that the doctor blade is not employed for wiping away an excessive amount of the etching resistant layer and that the peripheral speed of the gravure roll is not confined to a specific range.

A fourth preferable process is to employ an etching resistant layer-coating apparatus where a slit nozzle is substituted for the gravure roll in the step of forming the etching resistant layer in the aforementioned first preferable process.

According to a third aspect of the present invention, there is also provided a resist layer-coating apparatus for preparing a shadow mask, which comprises a gravure roll 20 mm to 60 mm in diameter, a member for feeding an etching resistant liquid onto the gravure roll, and a doctor blade which is disposed over the gravure roll;

wherein a strip-like metallic thin plate having a first main surface etched in advance forming a plurality of concaves thereon and a second main surface formed in advance with a resist layer having a plurality of openings is fed in substantially horizontal direction with the first main surface being faced downward; the gravure roll is disposed underneath and in contact with a portion of the first main surface of the metallic thin plate and rotated in a direction opposite to that of the metallic thin plate and at a peripheral speed of 4 to 25 times as high as that of a feeding speed of the metallic thin plate, while a portion of the second main surface which is located opposite to the contacting portion of first main surface is left free; and the etching resistant liquid is fed to the gravure roll and then transferred, while filling the concave with the etching resistant liquid, to the first main surface after any excessive amount of the etching resistant liquid on the first main surface is wiped away by the doctor blade, thereby forming an etching resistant layer on the first main surface.

According to a fourth aspect of the present invention, there is also provided an etching resistant layer-coating apparatus for preparing a shadow mask, which comprises a first coating apparatus, and a second coating apparatus comprising a gravure roll 20 mm to 60 mm in diameter, a member for feeding an etching resistant liquid onto the gravure roll, and a doctor blade which is disposed over the gravure roll;

wherein a strip-like metallic thin plate having a first main surface etched in advance forming a plurality of concaves thereon and a second main surface formed in advance with a resist layer having a plurality of openings is fed in substantially horizontal direction with the first main surface being faced downward; the first coating apparatus is disposed to face the first main surface of the metallic thin plate; the second coating apparatus is also disposed to face the first main surface of the metallic thin plate in such a manner that the gravure roll is disposed underneath and in contact with a portion of the first main surface of the metallic thin plate and rotated in a direction opposite to that of the metallic thin plate and at a peripheral speed of 4 to 25 times as high as that of a feeding speed of the metallic thin plate, while a portion of the second main surface which is located opposite to the contacting portion of first main surface is left free; and the etching resistant liquid is fed to the gravure roll and then transferred to the first main surface after any excessive amount of the etching resistant liquid on the first main surface is wiped away by the doctor blade, thereby forming an etching resistant layer on the first main surface.

The first coating apparatus to be employed in the fourth aspect of this invention may be constructed as follows.

A first preferable embodiment of the first coating apparatus comprises a first gravure roll 20 mm to 60 mm in diameter, a coating liquid-feeding member for feeding an etching resistant liquid onto the gravure roll, and a doctor blade which is disposed over the gravure roll;

wherein the gravure roll is disposed in contact with a portion of the first main surface of the metallic thin plate and rotated in a direction opposite to that of the metallic thin plate and at a peripheral speed of 4 to 25 times as high as that of a feeding speed of the metallic thin plate, while a portion of the second main surface of the metallic thin plate which is located opposite to the contacting portion of first main surface is left free; and the etching resistant liquid is fed to the gravure roll and then transferred to the first main surface after any excessive amount of the etching resistant liquid on the first main surface is wiped away by the first doctor blade.

A second preferable embodiment of the first coating apparatus is the same as that of the aforementioned first preferable embodiment except that the peripheral speed of the gravure roll is controlled to less than 4 times as high as that of the feeding speed of the metallic thin plate.

A third preferable embodiment is the same as that of the aforementioned first preferable embodiment except that the doctor blade for wiping away any excessive amount of the etching resistant layer from the gravure roll is no more provided. In this case, the peripheral speed of the gravure roll is not confined to a specific range.

A fourth preferable embodiment is to employ an etching resistant layer-coating apparatus where a slit nozzle is substituted for the gravure roll in the aforementioned first preferable embodiment.

According to the fourth aspect of this invention, there is also provided an etching resistant layer-coating apparatus for preparing a shadow mask, wherein the thickness of the etching resistant layer which has been formed by making use of the first coating apparatus is further controlled by the second coating apparatus.

According to this invention, since a gravure roll of relatively small diameter is employed and rotated in a direction opposite to that of a metallic thin plate and at a peripheral speed of 4 to 25 times as high as that of a feeding speed of the metallic thin plate in the coating of an etching resistant liquid on the surface of the metallic thin plate, a concave portion of rugged substrate such as a concave of the small hole of shadow mask can be easily filled with the etching resistant liquid.

The etching resistant layer to be obtained by this invention is free from the residual of air bubbles in a concave in particular, so that it is possible to obtain a uniform etching resistant layer. As a result, it is possible to prevent an undesirable side etching of the small hole in the aforementioned second step, thereby making it possible to obtain a shadow mask of excellent quality.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
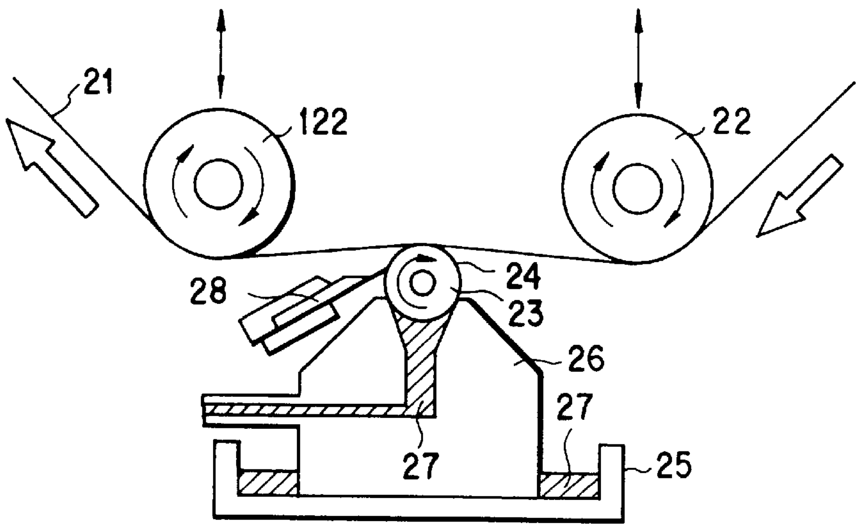
FIG. 1 is a side view schematically illustrating one example of an etching resistant layer-coating apparatus according to this invention.

The method of manufacturing a shadow mask according to this invention comprises the following steps. At first, a strip-like metallic thin plate having a first main surface where a plurality of concaves are formed thereon in advance through etching and a second main surface where a resist layer having a plurality of openings is formed thereon in advance is fed in substantially horizontal direction with the first main surface being faced downward.

Meanwhile, at least one etching resistant layer-coating apparatus, each being provided with a gravure roll 20 mm to 60 mm in diameter, with a member for feeding an etching resistant liquid onto the gravure roll, and with a doctor blade disposed over the gravure roll, is disposed beneath the first main surface of the metallic thin plate. Then, the gravure roll is allowed to contact with a portion of the first main surface and rotated in a direction opposite to that of said metallic thin plate and at a peripheral speed of 4 to 25 times as high as that of a feeding speed of said metallic thin plate, while a portion of the second main surface which is located opposite to the portion of first main surface which is contacted with the gravure roll is left free. At the same time, an etching resistant liquid is fed onto the surface of the gravure roll and any excessive amount of the etching resistant liquid is wiped away by means of the doctor blade and then the etching resistant liquid is transferred from the gravure to the first main surface, thereby to form an etching resistant layer on the first main surface of the metallic thin plate.

Then, the second main surface is etched to form through holes, each hole passing from the second main surface to the concave formed on the first main surface of the metallic thin plate.

By the aforementioned expression of "a portion of the second main surface which is located opposite to the portion of first main surface which is contacted with the gravure roll is left free", it is meant that any kind of supporting member such as a back roll to counterbalance the gravure roll is not disposed on a portion of the second main surface which is located opposite to the portion of first main surface which is contacted with the gravure roll.

As for the gravure roll, any roll provided with grooves of predetermined depth or with a thin metal wire wound around the surface thereof and having a relatively small diameter, e.g. about 20 mm to 60 mm may be employed.

Note that the etching resistant liquid means a liquid for forming the etching resistant layer.

The formation of a plurality of concaves on the first main surface by means of etching can be carried out as follows. Namely, first of all, a first resist layer provided with a plurality of openings is formed on a first main surface of a strip-like metallic thin plate, and at the same time, a second resist layer provided with a plurality of openings is formed on a second main surface of the strip-like metallic thin plate. Then, the first main surface of the strip-like metallic thin plate is subjected to an etching treatment.

Since a gravure roll of relatively small diameter, i.e. about 20 mm to 60 mm is rotated at a high peripheral speed in a direction opposite to the feeding direction of the strip-like metallic thin plate, a shearing force of large magnitude is generated thereby to allow an etching resistant liquid to be strongly thrust into a concave of a rugged substrate such as the concave of shadow mask. As a result, the air in the concaves can be easily replaced by the etching resistant liquid, thus making it possible to easily fill the concave with the etching resistant liquid.

Furthermore, since any excessive amount of an etching resistant liquid on the gravure roll is wiped away by means of a doctor blade, it is possible to easily form an etching resistant layer of uniform thickness.

As for the etching resistant liquid to be employed in the method of manufacturing a shadow mask according to this invention, a water-soluble thermosetting resin, a solvent type thermosetting resin, a non-solvent type UV-curing resin or a hot-melt resin can be employed. In particular, a non-solvent type UV-curing resin is most suited for use in the manufacture of a shadow mask according to this invention. When the etching resistant liquid to be employed is formed of a UV-curing type resin, the curing of the coated resin film can be performed by making use of a UV-curing lamp.

It may be preferable to dispose an auxiliary roll to contact with the second main surface at downstream side of the gravure roll so as to effectively perform the purging of air and the control of the thickness of coated layer.

A preferable range of the viscosity of the etching resistant liquid at the occasion of coating is 40 cps to 1,500 cps, more preferably 70 cps to 200 cps. The temperature of the etching resistant liquid at the occasion of coating should preferably be 20° C. to 70° C., more preferably 30° C. to 50° C. Since the coating apparatus to be employed in this invention is relatively small in heat capacity, a hot coating of a coating liquid can be easily performed and hence an etching resistant liquid heated to 20° C. to 70° C. can be easily prepared. Furthermore, the coating apparatus to be employed in this invention is designed such that the adjustment of temperature can be easily performed so as to make it possible to perform a coating under an optimum condition with regard to the viscosity, surface tension, etc. of a coating liquid. In this case, if the metallic thin plate is heated to 20° C. to 70° C. in prior to coating, it is possible to further optimize the quality of coating.

It is possible, if required, to employ one or more of an etching resistant liquid-coating apparatus. If two or more etching resistant liquid-coating apparatus are employed, it is possible to perform a coating of a liquid while completely replacing the air in a concave by a coating liquid so as to completely fill the concave with the coating liquid and, at the same time, to excellently control the thickness of the coated layer.

Even if only one etching resistant liquid-coating apparatus is employed, it is possible to perform a coating of a liquid while sufficiently replacing the air in a concave by a coating liquid and, at the same time, to control the thickness of the coated layer. The method of this invention can be applied to a substrate provided with dot-like concaves each having a depth of 40 to 50 $\mu$m and a diameter of 80 to 120 $\mu$m or more. Depending on the size and shape of the concave however, there is a possibility that the purging of air and the control of film thickness cannot be performed sufficiently.

The following method of manufacturing a shadow mask can be applied to the aforementioned case, and is one of preferably embodiments of method of manufacturing a shadow mask according to this invention. Namely, in this method, at least two coating apparatus, i.e. a first etching resistant liquid-coating apparatus and a second etching resistant liquid-coating apparatus are disposed in two stages thereby to perform the coating in two steps.

Specifically, according to this preferred embodiment, a strip-like metallic thin plate having a first main surface where a plurality of concaves are formed thereon in advance through etching and a second main surface where a resist layer having a plurality of openings is formed thereon in advance is prepared at first. Then, the first etching resistant liquid-coating apparatus is formed to face the first main surface of the metallic thin plate and an etching resistant liquid is applied to the first main surface.

Then, the metallic thin plate is fed in substantially horizontal direction with the first main surface being faced downward.

Meanwhile, the second etching resistant layer-coating apparatus provided with a gravure roll 20 mm to 60 mm in diameter, a member for feeding an etching resistant liquid onto the gravure roll, and a doctor blade disposed over the gravure roll is disposed beneath the first main surface of the metallic thin plate. Then, the gravure roll is allowed to contact with a portion of the first main surface and rotated in a direction opposite to that of said metallic thin plate and at a peripheral speed of 4 to 25 times as high as that of a feeding speed of said metallic thin plate, while a portion of the second main surface which is located opposite to the portion of first main surface which is contacted with the gravure roll is left free. At the same time, an etching resistant liquid is fed onto the surface of the gravure roll and any excessive amount of the etching resistant liquid is wiped away by means of the doctor blade and then the etching resistant liquid is transferred from the gravure to the first main surface, thereby to form an etching resistant layer on the first main surface of the metallic thin plate.

Then, the second main surface is etched to form through holes, each hole passing from the second main surface to the concave formed on the first main surface of the metallic thin plate.

As for the first etching resistant layer-coating apparatus, an apparatus having the same structure as that of the second etching resistant layer-coating apparatus can be employed. Namely, this first etching resistant layer-coating apparatus may be of a structure comprising a gravure roll 20 mm to 60 mm in diameter, a member for feeding an etching resistant liquid onto the gravure roll, and a doctor blade disposed over the gravure roll.

According to this apparatus, two similar coating apparatus, i.e. a first etching resistant liquid-coating apparatus and a second etching resistant liquid-coating apparatus are disposed in two stages thereby to perform the coating in two steps.

Alternatively, a coating apparatus employing a slit coater, or a coating apparatus having the same structure as that of the first etching resistant liquid-coating apparatus except that the doctor blade is not mounted thereon can be preferably employed.

When a slit coater is employed or when the doctor blade is not employed, an excessive volume of an etching resistant liquid can be fed to the surface of the metallic thin plate. When the doctor blade is not employed, the peripheral speed of the gravure coater can be optionally determined.

When an apparatus having the same structure as that of the second etching resistant layer-coating apparatus is employed and the gravure roll thereof is rotated at a peripheral speed 4 to 25 times as high as that of a feeding speed of the metallic thin plate, a suitable volume of an etching resistant liquid can be fed to the surface of the metallic thin plate. On the other hand, if the peripheral speed of the gravure roll is maintained to less than 4 times as high as that of a feeding speed of the metallic thin plate, an excessive volume of an etching resistant liquid can be fed to the surface of the metallic thin plate.

When a slit coater is employed, the metallic thin plate should preferably be disposed such that the first main surface thereof is directed upward. Whereas, if a gravure coater is employed, the metallic thin plate should preferably be disposed such that the first main surface thereof is directed downward.

In the coating method employing this coating apparatus, the thickness of a coated layer which has been formed by the first etching resistant layer-coating apparatus is further regulated by the second etching resistant layer-coating apparatus, so that the air in a concave can be completely replaced at first by an etching resistant liquid by the first etching resistant layer-coating apparatus and then the thickness of a coated layer formed by the first etching resistant layer-coating apparatus can be suitably regulated by the second etching resistant layer-coating apparatus.

According to the method employing these apparatus, a concave of larger depth or fine shape, or even the concave of small hole of shadow mask where a residual resist is left remain can be sufficiently filled with a coating liquid.

As mentioned above, an etching resistant liquid is fed in advance onto the surface of the metallic thin plate by the first etching resistant layer-coating apparatus, and, while allowing the air existing in the concave to be sufficiently replaced by the etching resistant liquid fed in advance, the film thickness of the etching resistant layer is regulated by the second etching resistant layer-coating apparatus.

It is possible to suitably apply this method to a two-stage etching of thick shadow mask for a large home color picture tube where a rectangular concave having a depth of 80 μm to 120 μm and an opening size of 70 μm×170 μm to 200 μm×700 μm. In particular, if an excessive volume of an etching resistant liquid is coated, the air existing in the rectangular concave can be sufficiently replaced by the etching resistant liquid without inviting any deficiency of the etching resistant liquid.

Furthermore, even if a step of removing a resist layer around the small holes in subsequent to the first etching step is omitted, it is still possible to sufficiently fill the small holes with an etching resistant liquid so that the manufacturing cost can be saved.

It is possible in the aforementioned methods according to this invention to suitably select a coating apparatus depending on the dimension and shape of apertures desired in the shadow mask.

This invention will be further explained with reference to the drawings as follows.

FIG. 1 shows a side view schematically illustrating one example of an etching resistant layer-coating apparatus according to a first embodiment of this invention.

Referring to FIG. 1, the reference numeral 21 represents a strip-like metallic thin plate constituting a substrate of a shadow mask. The strip-like metallic thin plate 21 is suspended over a pair of tension roll 22 and 122 which are adapted to move up and down by a driving means (not shown). This strip-like metallic thin plate 21 is designed to be shifted from right to left in the drawing, and also designed to be moved substantially horizontally in the region of coating an etching resistant liquid. A gravure roll 23 having a diameter of about 20 mm to 60 mm is disposed underneath the metallic thin plate 21. The gravure roll 23 is designed to be rotated at a high speed in a direction opposite to the running direction of the metallic thin plate 21 by a driving motor (not shown) which is connected directly or indirectly to the gravure roll 23. The outer peripheral surface of the gravure roll 23 is provided with an engraved portion 24 for filling therein an etching resistant liquid 27. The engraved portion 24 of the gravure roll 23 is formed of spiral grooves, about 0.120 mm to 0.260 mm in pitch and about 30 μm to 100 μm in depth, which are inclined by an angle of 70° C. in relative to the axis of the gravure roll 23. A vessel 25 mounted on a table (not shown) is fixedly disposed below the gravure roll 23 so as to receive an over-flow portion of the etching resistant liquid. A coating liquid feed nozzle 26 for feeding the etching resistant liquid 27 to the gravure roll

23 is disposed over the vessel 25. A doctor blade 28 is disposed over a portion of the engraved portion 24 of the gravure roll 23 which is located immediately before the point where the etching resistant liquid 27 from the coating liquid feed nozzle 26 is transferred to the metallic thin plate 21. This doctor blade 28 functions to wipe away any excessive portion of the etching resistant liquid 27 that has been coated on the engraved portion 24.

At the occasion of coating the etching resistant liquid 27 on the metallic thin plate 21, the bottom surfaces of the tension rolls 22 and 122 are lowered down to a level which is lower than the upper surface of the metallic thin plate 21 contacting with the gravure roll 23 so as to regulate the contacting angle and contacting area between the gravure roll 23 and the metallic thin plate 21. On the other hand, at the occasion when the coating is not performed, the tension rolls 22 and 122 are moved upward so as to allow the bottom surface of the metallic thin plate 21 to be kept away from the gravure roll 23. An upper surface portion of the metallic thin plate 21 which is located just over the gravure roll 23 is always left free, i.e. any kind of supporting roll such as a back roll is not disposed on this portion.

Since the gravure roll 23 employed in the coating apparatus of this invention is relatively small in diameter, i.e. about 20 mm to 60 mm in diameter, the contacting area between the gravure roll 23 and the metallic thin plate 21 is also small. Furthermore, since the gravure roll 23 is rotated at a peripheral speed higher than that of the feeding speed of the metallic thin plate 21 and in a direction opposite to the feeding direction of the metallic thin plate 21 at the occasion of coating the etching resistant liquid, a shearing force of large magnitude is caused to generate at the occasion of coating the etching resistant liquid. As a result, a force of thrusting the etching resistant liquid 27 into the concave is promoted, so that the air in the concaves can be easily replaced by the etching resistant liquid. Thus, it possible according to this invention to easily fill the concaves of rugged metallic thin plate 21 with the etching resistant liquid 27. Moreover, since the layer of the etching resistant liquid 27 on the engraved portion 24 is always regulated to a predetermined uniform thickness before the layer of the etching resistant liquid 27 is transferred to the metallic thin plate 21, it is possible to stabilize the film thickness and coating condition of the etching resistant layer.

Figure 2:
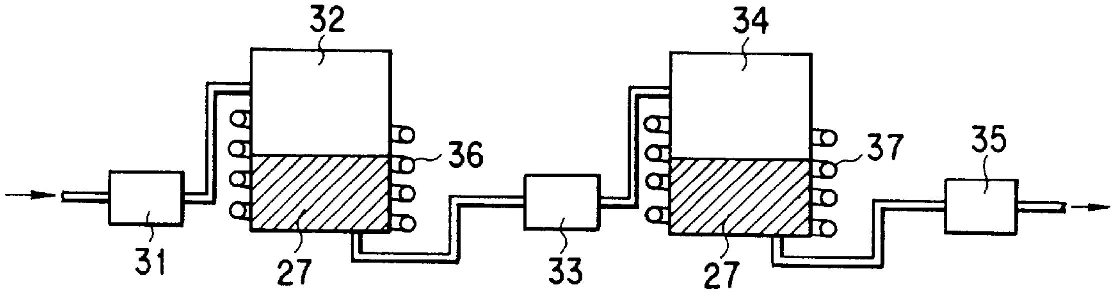
FIG. 2 is a side view schematically illustrating a supplying system for supplying an etching resistant liquid to the apparatus shown in FIG. 1.

FIG. 2 illustrates a schematic view of a coating liquid-supply system for feeding a heated etching resistant liquid 27 to the coating liquid feed nozzle 26 shown in FIG. 1. Referring to FIG. 2, the reference numeral 31 denotes a diaphragm pump for transferring the etching resistant liquid 27 collected in the vessel 25 to a service tank 32. The etching resistant liquid 27 thus transferred to the service tank 32 is subjected to a defaming treatment and then to a heat treatment. The etching resistant liquid 27 thus treated is then transferred to a working tank 34 by means of a diaphragm pump 33. The etching resistant liquid 27 thus transferred to the working tank 34 is adjusted of its temperature to the final coating temperature, and then transferred to the coating liquid feed nozzle 26 by means of a diaphragm pump 35. The reference numerals 36 and 37 are pipes for transferring hot water to the service tank 32 and the working tank 34, respectively for heating them.

The two-stage etching method employing the etching resistant liquid-coating apparatus shown in FIGS. 1 and 2 can be performed as follows.

A First Etching Step:

First of all, a strip-like metallic thin plate provided on its both surfaces with resist films each having a predetermined opening pattern is prepared. Part of the both surfaces of the metallic thin plate are exposed through these openings. Then, one of the surfaces of the metallic thin plate is directed downward and subjected to an etching treatment through the openings of the resist film formed thereon, thereby forming concaves on this one surface, each corresponding to the openings of the resist film. Subsequently, the resist film on this one surface is removed. Etching resistant layer-forming step:

Then, while the surface of the metallic thin plate where the concaves are formed in the previous first etching step is being directed downward, an etching resistant liquid is coated on this surface, by making use of the etching resistant liquid-coating apparatus of this invention, thus filling the concaves with the etching resistant liquid and forming an etching resistant layer on the surface. In this apparatus, a gravure roll having a diameter of about 20 mm to 60 mm is disposed underneath the strip-like metallic thin plate running at a speed of V (m/min.). On the other hand, the gravure roll is allowed to rotate in a direction opposite to the running direction of the metallic thin plate and at a peripheral velocity of 4V (m/min.) to 25V (m/min.). In this case, an upper surface portion of the metallic thin plate which is located just over the gravure roll is left free. The etching resistant liquid is fed to the surface of the gravure roll and, after any excessive volume thereof is wiped away by making use of a doctor blade from the surface of the gravure roll, the etching resistant liquid is coated on the bottom surface of the metallic thin plate.

A Second Etching Step:

Subsequently, the strip-like metallic thin plate is subjected to an etching treatment, whereby allowing the etching of the surface provided with the etching resistant layer and of the opposite surface to proceed through openings of resist formed thereon, thus forming through-holes, each communicating with the concaves which have been formed in the aforementioned first etching step.

Figure 3:
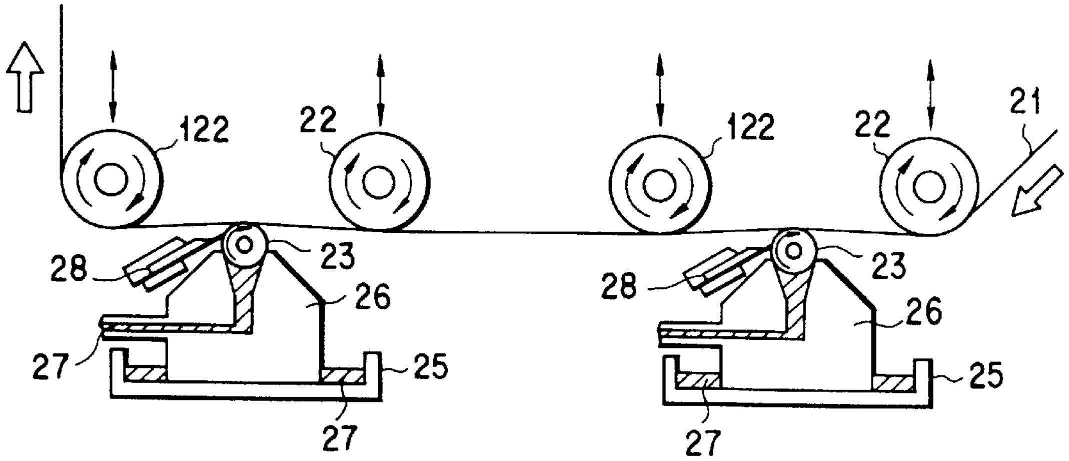
FIG. 3 is a side view schematically illustrating another example of an etching resistant layer-coating apparatus according to this invention.

FIG. 3 schematically illustrates one example of the etching resistant liquid-coating apparatus according to a second embodiment of this invention.

The etching resistant liquid-coating apparatus shown in FIG. 3 comprises a couple of coating apparatus, each having the same structure as that shown in FIG. 1, which are juxtaposed in a row.

In the coating apparatus shown in FIG. 3, the air in a concave is completely replaced at first by an etching resistant liquid supplied by the first etching resistant layer-coating apparatus, and then the thickness of a coated layer formed by the first etching resistant layer-coating apparatus can be suitably regulated by the second etching resistant layer-coating apparatus. It is possible with the employment of this apparatus to sufficiently fill a concave of larger depth or fine shape, or even the concave of small hole of shadow mask where a residual resist is left remain with a coating liquid.

Figure 4:
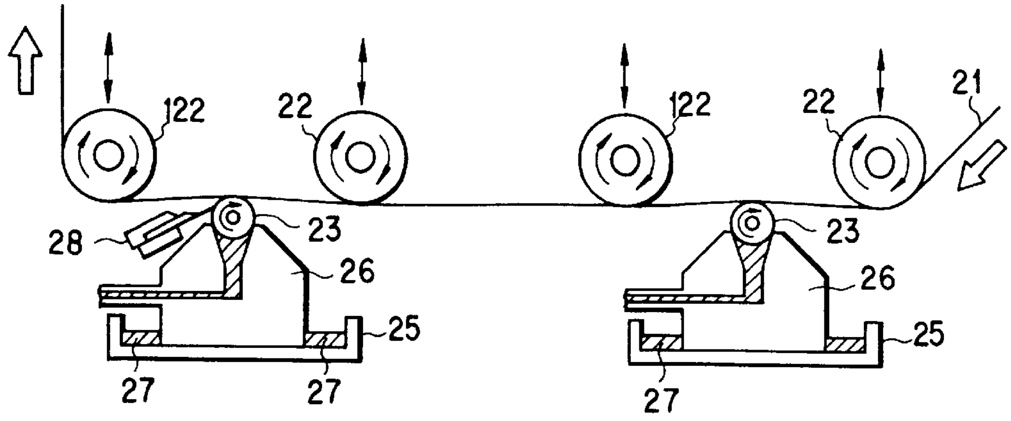
FIG. 4 is a side view schematically illustrating a further example of an etching resistant layer-coating apparatus according to this invention.

FIG. 4 schematically illustrates another example of the etching resistant liquid-coating apparatus according to a second embodiment of this invention.

The etching resistant liquid-coating apparatus shown in FIG. 4 comprises a first coating apparatus of the same structure as shown in FIG. 1 except that the doctor blade is not mounted thereon, and a second coating apparatus of the same structure as shown in FIG. 1, which is disposed on the downstream side of the first coating apparatus.

Figure 5:
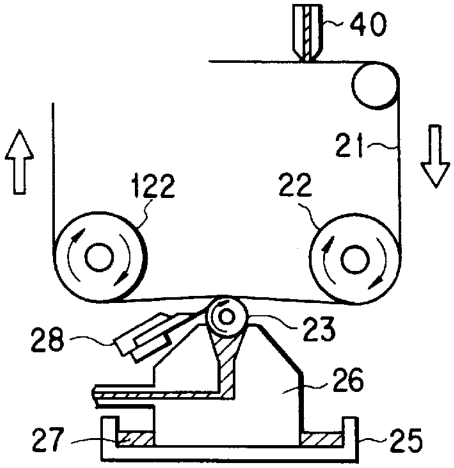
FIG. 5 is a side view schematically illustrating a still another example of an etching resistant layer-coating apparatus according to this invention.

FIG. 5 schematically illustrates still another example of the etching resistant liquid-coating apparatus according to a second embodiment of this invention.

The etching resistant liquid-coating apparatus shown in FIG. 5 comprises a slit nozzle 40 functioning as a first coating apparatus, and a second coating apparatus of the same structure as shown in FIG. 1, which is disposed on the downstream side of the slit nozzle 40.

Since the slit nozzle 40 is employed as a first coating apparatus in the apparatus shown in FIG. 5, the metallic thin plate is arranged such that the surface to be coated with an etching resistant liquid is directed upward in the first stage, but directed downward in the second stage.

In the employment of the coating apparatus shown in FIGS. 4 and 5, an excessive volume of an etching resistant liquid is fed onto the surface of the metallic thin plate by the first etching resistant layer-coating apparatus, and then the etching resistant liquid supplied excessively is thrust into the concaves by the second etching resistant layer-coating apparatus and, at the same time, the thickness of a coated layer can be suitably regulated by the second etching resistant layer-coating apparatus, thereby obtaining a coated layer of desired uniform thickness.

When the coating apparatus shown in FIGS. 4 and 5 are employed, a concave having such a large depth that could not be filled with a coating liquid by the apparatus shown in FIGS. 1 and 3 can be filled with a coating liquid.

Figure 6:
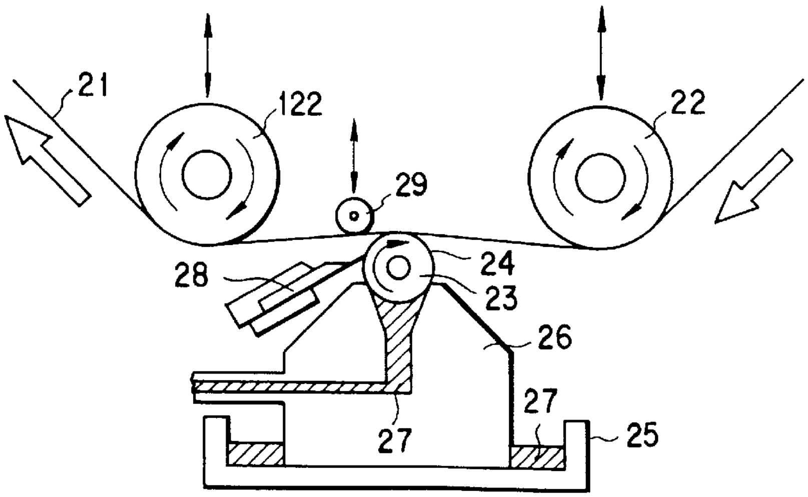
FIG. 6 is a side view schematically illustrating a still another example of an etching resistant layer-coating apparatus according to this invention.

FIG. 6 schematically illustrates one of preferable examples of the etching resistant liquid-coating apparatus according to a first embodiment of this invention.

As shown in FIG. 6, this apparatus is substantially the same as that shown in FIG. 1 except that an auxiliary roll 29 is disposed over a portion of the metallic thin plate which is adjacent to and on the downstream side of a point where the gravure roll 23 is contacted with the metallic thin plate. When this auxiliary roll 29 is employed, the air in the concave can be effectively replaced by an etching resistant liquid, thereby making it possible to effectively control the thickness of the etching resistant layer. Furthermore, when this auxiliary roll 29 is employed in an etching resistant liquid-coating apparatus, a concave of relatively small diameter and large depth can be satisfactorily filled with an etching resistant liquid, without requiring a couple of coating apparatus as shown in FIG. 3.

Next, one example of color picture tube employing a shadow mask obtained according to this invention will be explained as follows.

Figure 7:
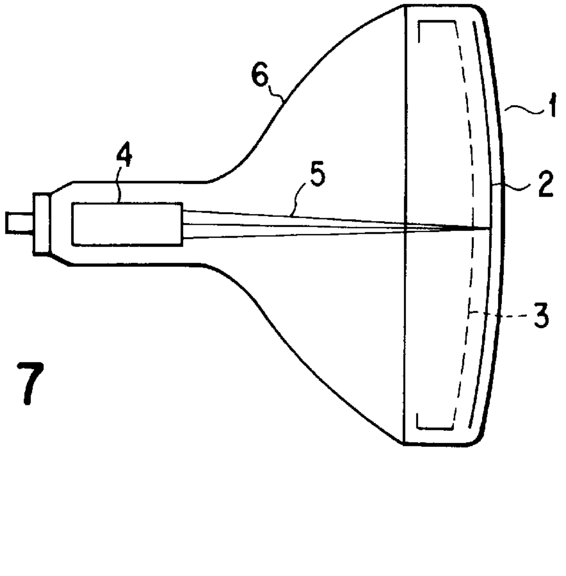
FIG. 7 is a side view schematically illustrating one example of a color picture tube employing a shadow mask which is prepared according to this invention.

FIG. 7 schematically illustrates one example of color picture tube employing a shadow mask obtained according to this invention.

This shadow mask type color picture tube comprises, as shown in FIG. 7, a vacuum housing 6, a fluorescent screen 2 comprising a 3-color fluorescent layer, i.e. red, green and blue layers, and mounted on the inner face of a panel 1 constituting a portion of the vacuum housing 6, and a shadow mask 3 of this invention, which is spaced apart by a predetermined distance from the fluorescent screen 2 and provided all over the surface thereof with a large number of apertures having a predetermined size and arrayed in a predetermined pitch, the shadow mask 3 functioning as a color-selecting electrode. Since the shadow mask to be obtained by this invention is uniform regarding the aperture shape and size thereof, i.e. excellent in uniformity of quality, electron beams 5 emitted from an electron gun 4 can be precisely landed on a predetermined fluorescent layer.

EXAMPLES

Example 1

FIGS. 8 to 16 illustrate the process of the two-stage etching method and changes in cross-sectional shape of a metallic thin plate. First of all, an Invar plate having a thickness of 0.12 mm and formed of iron-nickel alloy containing 36 wt % of nickel is prepared as a metallic thin plate 7.

Figure 8:
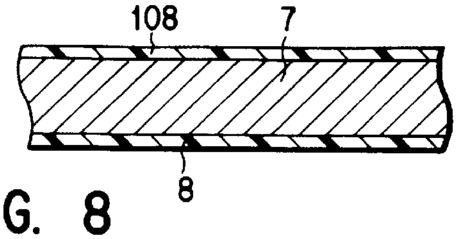
FIGS. 8 to 16 show cross-sectional views illustrating a process of manufacturing a shadow mask according to this invention.
Figure 13:
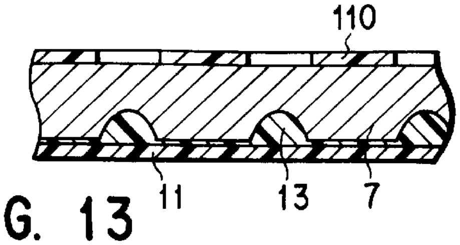

Photosensitive film-forming step:

The rolling oil and rust preventive oil that have been adhered on the surface of the metallic thin plate 7 were removed by means of degreasing and washing, and the resultant metallic thin plate 7 was allowed to dry. Subsequently, as shown in FIG. 8, a water-soluble photosensitive agent consisting mainly of casein and dichromate was coated on the both surfaces of the metallic thin plate 7 and then dried thereby to form photosensitive films 8 and 108 having a thickness of several microns.

Figure 9:
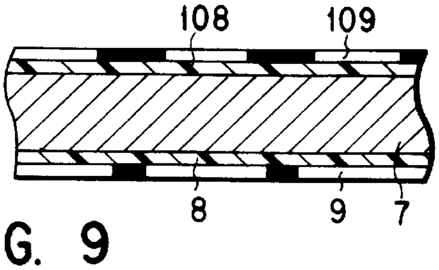

Light Exposure Step:

First of all, a pair of photomasks were prepared. Specifically, an original plate 9 provided with a pattern corresponding to the pattern of small holes of the shadow mask which face the electron gun was prepared, and at the same time, an original plate 109 provided with a pattern corresponding to the pattern of large holes of the shadow mask which face the fluorescent screen was prepared. Then, as shown in FIG. 9, these original plates 9 and 109 were closely contacted respectively with the photosensitive films 8 and 108, which were subsequently exposed to light through these original plates 9 and 109, thereby printing the patterns of these original plates 9 and 109 on the photosensitive films 8 and 108, respectively.

Figure 10:
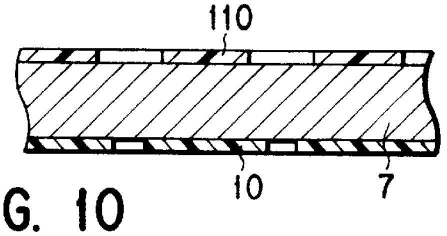

Developing Step:

Thereafter, the photosensitive films 8 and 108 printed respectively with the aforementioned patterns were allowed to develop by making use of water, thereby removing the unsensitized portions to expose part of the surface of metallic thin plate. As a result, a pair of resist patterns 10 and 110 corresponding respectively to the patterns of the original plates 9 and 109 were prepared as shown in FIG. 10.

Figure 11:
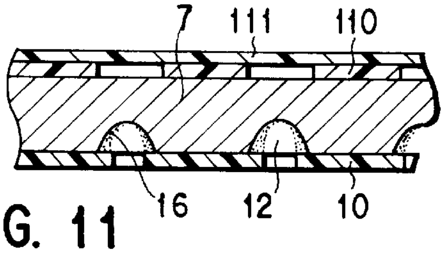

First Etching Step:

As shown in FIG. 11, a protective film 111 comprising an etching-resistive resin film such as CPP and an adhesive coated on the etching-resistive resin film was adhered onto the surface where the resist 110 was formed. On the other hand, a ferric chloride solution as an etching liquid was sprayed onto the surface where the resist 10 was formed thereby performing an etching of the surface. As a result, the exposed portions of the surface of metallic thin plate where the resist 10 was formed were etched, whereby forming smaller concaves 12 on the surface of the shadow mask facing the electron gun.

Figure 12:
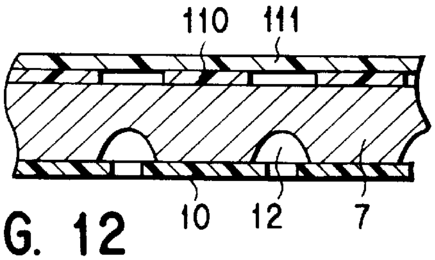

Termination of the First Etching Step:

After finishing the first etching step, industrial water was sprayed onto the metallic thin plate 7 to wash the surface of the metallic thin plate 7 to remove, in particular, any residual etching liquid 16 remaining in the concave 12, thereby performing a uniform and rapid washing of the surface of the metallic thin plate. As a result, as shown in FIG. 12, the surface of the metallic thin plate 7 was completely washed removing any residual etching liquid 16 in the small concaves 12.

Etching resistant layer-forming step:

The resist 10 formed on the etched surface was removed by making use of an aqueous solution of sodium hydroxide, and then this etched surface was washed by spraying it with industrial water and pure water. After being dried, the protective film 111 formed on the surface where the resist 10 was formed was removed, and then an etching resistant liquid was coated on this surface by making use of a coating apparatus shown in FIGS. 1 and 2, thereby filling the small concave 12 with the etching resistant liquid. The etching resistant liquid employed in this case was formed of a water-soluble casein-acrylic resin. The viscosity of this etching resistant liquid was 60 cps at a temperature of 25° C.

Then, the etching resistant liquid comprising a water-soluble casein-acrylic resin was heated for 4 minutes at a temperature of 150° C., whereby forming an etching resistant layer 13 having a film thickness of about 15 μm to 20 μm. Thereafter, a protective film 11 was formed on this etching resistant layer 13.

Figure 14:
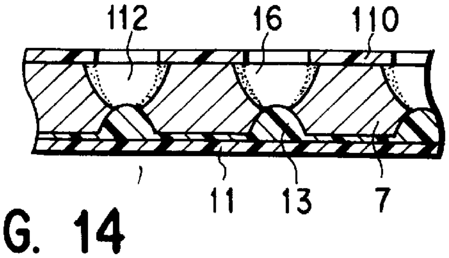

Second Etching Step:

As shown in FIG. 14, a ferric chloride solution as an etching liquid was sprayed onto the surface where the resist 110 was formed thereby performing an etching of the surface. As a result, large holes 112 of the shadow mask facing the fluorescent screen were formed on the surface of metallic thin plate where the resist 110 was formed. As a result, through-holes each communicating with the smaller concave 12 were formed.

Figure 15:
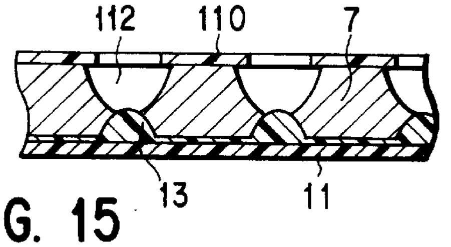

Termination of the Second Etching Step:

After finishing the second etching step, industrial water was sprayed onto the metallic thin plate 7 to wash the surface of the metallic thin plate 7 to remove, in particular, any residual etching liquid 16 remaining in the large holes 112, thereby performing a uniform and rapid washing of the surface of the metallic thin plate. As a result, as shown in FIG. 15, the surface of the metallic thin plate 7 was completely washed removing any residual etching liquid 16 in the large holes 112.

Figure 16:
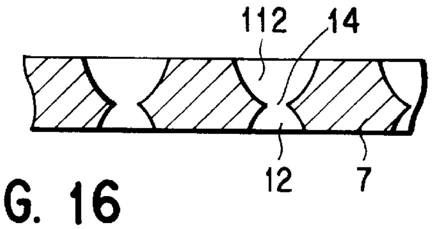

Subsequently, the protective film 11 formed on the other side was removed. Thereafter, a separating apparatus (not shown) was employed to remove, by making use of an aqueous solution of sodium hydroxide, the resist 110 formed on the surface where the large holes 112 were formed, and at the same time, to remove, by making use of an aqueous solution of sodium hydroxide, the etching resistant layer 13 formed on the surface where the small holes 12 were formed. Furthermore, the metallic thin plate was subjected to water-washing and drying treatment, thereby forming dot-like through-holes 14, each communicating with both small hole 12 and large hole 112, in the metallic thin plate as shown in FIG. 16. The small hole of the shadow mask obtained in this example were 120 μm in diameter, 50 μm in depth and 0.25 mm in pitch.

The peripheral speed of the gravure roll in relative to the feeding speed of the metallic thin plate was varied in the range of 1.07 to 25.2 times in the aforementioned step of forming an etching resistant layer to investigate the influence of the peripheral speed of the gravure roll on the filling condition of the small hole, i.e. how the small hole was filled with the etching resistant liquid after the etching resistant liquid-filling step. Furthermore, the generation of defective aperture size after the second etching step was investigated. These filling condition and the generation of defective aperture size were evaluated in total, the results of this evaluation are shown in Table 1. In this Table 1, the mark, "○" represents the results which indicated an excellent filling condition and no problem was found after the second etching; the mark, "Δ" represents the results which indicated a generation of defective filling at a ratio of one in every 10 samples and a trouble was found after the second etching step; and the mark, "X" represents the results which indicated an incomplete filling condition and a large number of defectives were found after the second etching step.

Example 2

The same procedures as illustrated in Example 1 were repeated to prepare a shadow mask except that the diameter of the small hole was set to 80 μm, the depth of the small hole was set to 40 μm, and the pitch of the holes was set to 0.20 mm. The results of total evaluation are shown in Table 1.

Example 3

The same procedures as illustrated in Example 1 were repeated to prepare a shadow mask except that the size of the small hole was set to 70 μm×170 μm (i.e. rectangular in shape), and the depth of the small hole was set to 40 μm. The results of total evaluation are shown in Table 1.

Comparative Examples 1 to 3

The same procedures as illustrated in Examples 1 to 3 were repeated to prepare a shadow mask except that the conventional pipe doctor/nozzle coater was substituted for the coating apparatus shown in FIGS. 1 and 2 in the step of forming an etching resistant layer. The results of total evaluation are shown in Table 1.

TABLE 1

| | | Total evaluation | | | | | | | |
|---|---|---|---|---|---|---|---|---|---|
| | | Ratio in speed of gravure roll to Metallic thin plate | | | | | | | |
| | | 1.07 | 3.14 | 3.77 | 6.28 | 12.6 | 24.1 | 25.2 | |
| Example | 1 | X | X | Δ | ○ | ○ | ○ | Δ | |
| | 2 | X | X | Δ | ○ | ○ | ○ | Δ | |
| | 3 | X | X | Δ | ○ | ○ | ○ | Δ | |
| Comparative | 1 | | | | — | | | | ○ |
| Example | 2 | | | | — | | | | Δ |
| | 3 | | | | — | | | | Δ |

As seen from Table 1, when the peripheral speed of the gravure roll is controlled to the range 4 to 25 times as high as the feeding speed of the metallic thin plate, a more excellent filling condition as compared with the conventional method can be obtained. Additionally, it will be seen that, when this invention is adopted, an excellent filling of a coating liquid can be easily performed even in a rectangular aperture of small size or a small aperture of large depth, which has been very difficult to fill a coating liquid therein according to the conventional method.

Additionally, it will be seen from these results that an etching resistant layer having a uniform film thickness and a uniform quality can be obtained by controlling the peripheral speed of the gravure roll to the range 4 to 25 times as high as the feeding speed of the metallic thin plate. As a result, a shadow mask obtained according to this method has been found excellent in quality. It will be also seen from these results that, according to this invention, an undesirable side etching phenomenon at the small hole portion during the second etching step can be avoided, thus making it possible to obtain an excellent shadow mask.

Example 4

The same procedures as illustrated in Example 1 were repeated to prepare a shadow mask except that a UV-curing type etching resistant liquid comprising a non-solvent type acrylate resin, acrylate monomer and a photopolymerization initiator and exhibiting a viscosity of 100 cps at a temperature of 50° C. was substituted for the etching resistant liquid comprising a water-soluble casein-acrylic resin. The results of total evaluation are shown in Table 2.

Example 5

The same procedures as illustrated in Example 5 were repeated to prepare a shadow mask except that the diameter of the small hole was set to 80 μm, the depth of the small hole was set to 40 μm, and the pitch of the holes was set to 0.20 mm. The results of total evaluation are shown in Table 2.

Example 6

The same procedures as illustrated in Example 4 were repeated to prepare a shadow mask except that the size of the small hole was set to 70 μm×170 μm (i.e. rectangular in shape), and the depth of the small hole was set to 40 μm. The results of total evaluation are shown in Table 2.

Example 7

The same procedures as illustrated in Example 4 were repeated to prepare a shadow mask except that the thickness of the metallic thin plate was set to 0.22 mm, the size of the small hole was set to 130 μm×450 μm (i.e. rectangular in shape), the depth of the small hole was set to 80 μm, and the pitch of the holes was set to 0.65 mm. The results of total evaluation are shown in Table 2.

Example 8

The same procedures as illustrated in Example 4 were repeated to prepare a shadow mask except that an apparatus shown in FIG. 4 was employed in the step of forming an etching resistant layer, and that the thickness of the metallic thin plate was set to 0.25 mm, the size of the small hole was set to 130 μm×550 μm (i.e. rectangular in shape), the depth of the small hole was set to 100 μm, and the pitch of the holes was set to 0.60 mm. The results of total evaluation are shown in Table 2.

Comparative Examples 4 to 8

The same procedures as illustrated in Examples 4 to 8 were repeated to prepare a shadow mask except that the conventional pipe doctor/nozzle coater was employed in the step of forming an etching resistant layer. The results of total evaluation are shown in Table 2.

TABLE 2

| | | Total evaluation | | | | | | | |
|---|---|---|---|---|---|---|---|---|---|
| | | Ratio in speed of gravure roll to Metallic thin plate | | | | | | | |
| | | 1.07 | 3.14 | 3.77 | 6.28 | 12.6 | 24.1 | 25.2 | |
| Example | 4 | X | Δ | ○ | ○ | ○ | ○ | Δ | |
| | 5 | X | Δ | ○ | ○ | ○ | ○ | Δ | |
| | 6 | X | X | ○ | ○ | ○ | ○ | Δ | |
| | 7 | X | X | Δ | ○ | ○ | ○ | Δ | |
| | 8 | X | X | X | ○ | ○ | ○ | Δ | |
| Comparative Example | 4 | | | | — | | | | ○ |
| | 5 | | | | — | | | | Δ |
| | 6 | | | | — | | | | Δ |
| | 7 | | | | — | | | | X |
| | 8 | | | | — | | | | X |

Example 9

The same procedures as illustrated in Example 4 were repeated to prepare a shadow mask except that the procedures for the removal of the resist 10 after the first etching step were omitted (that is, the resist layer 10 was left remained on the surface of the metallic thin plate 7), and that a single-stage type coating apparatus as shown in FIGS. 1 and 2; a single-stage type coating apparatus provided with an auxiliary roll as shown in FIG. 6; a two-stage type coating apparatus comprising a blade-less coating apparatus and a coating apparatus provided with a blade as shown in FIG. 4; and a two-stage type coating apparatus comprising a pair of coating apparatus each provided with a blade as shown in FIG. 3 were substituted respectively for the coating apparatus employed in Example 4 thereby to prepare a shadow mask in each embodiment. In this case, the thickness of the etching resistant layer was set to 30 μm to 40 μm in the cases of the single-stage type coating apparatus, 15 μm to 20 μm in the cases of the two-stage type coating apparatus and the auxiliary roll-attached coating apparatus. The results of total evaluation are shown in Table 3.

TABLE 3

| Construction | Ratio in speed of gravure roll to Metallic thin plate | | | | | | |
|---|---|---|---|---|---|---|---|
| of coating apparatus | 3.14 | 3.77 | 4.83 | 9.69 | 14.6 | 19.3 | 24.1 |
| Single | X | X | X | Δ | ○ | ○ | ○ |
| Single + Auxiliary roll | X | X | Δ | ○ | ○ | ○ | ○ |
| Two-stage (one without a blade + one with a blade) | X | Δ | ○ | ○ | ○ | ○ | ○ |
| Two-stage (all attached with a blade) | X | Δ | ○ | ○ | ○ | ○ | ○ |

As seen from Table 3, when an etching resistant layer-coating apparatus of this invention is employed and the peripheral speed of the gravure roll is suitably controlled in relative to the feeding speed of the metallic thin plate, it is possible to suitably perform a coating of liquid even before the resist pattern is removed, thereby overcoming the difficulty according to the method of the prior art in performing a coating of liquid before the resist pattern is removed. Since the resist pattern is no more required to be removed as mentioned above, it is possible to simplify the manufacturing process of shadow mask as a whole.

Although it was possible to obtain an excellent coating condition even in the case of single-stage coating apparatus by setting the peripheral speed of the gravure to about 10 times higher than that of the feeding speed of the metallic thin plate, it is desirable to employ a two-stage type coating apparatus or an auxiliary roll-attached coating apparatus in view of the large film thickness required in the case of the single-stage coating apparatus.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a shadow mask, said method comprising:

feeding in a substantially horizontal direction a strip-like metallic thin plate having a first main surface and a second main surface in such a manner that said first main surface faces downward, said first main surface being previously etched and having a plurality of concave sections formed thereon, and said second main surface being previously formed with a resist layer, the resist layer having a plurality of openings;

(i) coating an etching resistant liquid on said first main surface, and (ii) filling said concave sections with said etching resistant liquid while coating said etching resistant liquid, coating said etching resistant liquid by making use of an etching resistant layer-coating apparatus which is disposed beneath said first main surface of the metallic thin plate, thereby forming an etching resistant layer on said first main surface, said etching resistant layer-coating apparatus being provided with a gravure roll 20 mm to 60 mm in diameter, a member for feeding said etching resistant liquid onto said gravure roll, and a doctor blade disposed over said gravure roll;

wherein said coating of said etching resistant liquid on said first main surface is performed by (i) contacting a portion of said first main surface with a surface of said gravure roll carrying said etching resistant liquid, an excessive amount of said etching resistant liquid being wiped away in advance of said coating by means of said doctor blade, while a portion of said second main surface which is located opposite to said portion of said first main surface remains free of contact by said gravure roll, an auxiliary roll being adapted for contact with the second main surface downstream of said portion of said second main surface, and (ii) under conditions that said gravure roll is rotated in a direction opposite to that of said metallic thin plate and at a peripheral speed of 4 to 25 times as high as that of a feeding speed of said metallic thin plate; and etching said second main surface to form a plurality of through holes from said plurality of openings, each through hole (i) corresponding to one of the plurality of openings and (ii) passing from said second main surface to one concave section of said plurality of concave sections formed on said first main surface.

2. The method according to claim 1, wherein said etching resistant liquid is substantially formed of a UV-curing type resin.

3. The method according to claim 1, wherein said plurality of concave sections on said first main surface are formed by a process wherein (i) said strip-like metallic thin plate having a first main surface provided with a first resist layer having a plurality of openings and a second main surface provided with a second resist layer having a plurality of openings, is prepared first and then, (ii) said first main surface is subjected to an etching treatment thereby forming said plurality of concave sections.

4. The method according to claim 3, wherein said etching resistant liquid is coated before said first resist layer is removed.

5. A method of manufacturing a shadow mask, said method comprising:

preparing a strip-like metallic thin plate having a first main surface previously etched and having a plurality of concave sections formed thereon and a second main surface previously formed with a resist layer, the resist layer having a plurality of openings;

coating an etching resistant liquid to said first main surface by means of a first etching resistant layer-coating apparatus;

feeding in a substantially horizontal direction said metallic thin plate in such a manner that said first main surface faces downward;

(i) coating said etching resistant liquid on said first main surface, and (ii) filling said concave sections with said etching resistant liquid while coating said etching resistant liquid, coating said etching resistant liquid by making use of a second etching resistant layer-coating apparatus which is disposed beneath said first main surface of the metallic thin plate, thereby forming an etching resistant layer on said first main surface while regulating a thickness of said etching resistant layer coated by said first etching resistant layer-coating apparatus; said second etching resistant layer-coating apparatus being provided with a gravure roll 20 mm to 60 mm in diameter, a member for feeding said etching resistant liquid onto said gravure roll, and a doctor blade disposed over said gravure roll;

wherein said coating of said etching resistant liquid on said first main surface by said second apparatus is performed by (i) contacting a portion of said first main surface with a surface of said gravure roll carrying said etching resistant liquid after an excessive amount of said etching resistant liquid is wiped away by means of said doctor blade, while a portion of said second main surface which is located opposite to said portion of said first main surface remains free of contact by said gravure roll, and (ii) under conditions that said gravure roll is rotated in a direction opposite to that of said metallic thin plate and at a peripheral speed of 4 to 25 times as high as that of a feeding speed of said metallic thin plate; and etching said second main surface to form a plurality of through holes from said plurality of openings, each through hole (i) corresponding to one of the plurality of openings and (ii) passing from said second main surface to one concave section of said plurality of concave sections formed on said first main surface.

6. The method according to claim 5, wherein said first etching resistant layer-coating apparatus comprises a gravure roll 20 mm to 60 mm in diameter, a member for feeding an etching resistant liquid onto said gravure roll, and a doctor blade which is disposed over said gravure roll; and said coating an etching resistant liquid to said first main surface by means of a first etching resistant layer-coating apparatus is performed by contacting a portion of said first main surface to be moved horizontally with a surface of said gravure roll carrying said etching resistant liquid, while a portion of said second main surface located opposite to said portion of first main surface remains free of contact by said gravure roll, thereby feeding the etching resistant liquid to said first main surface.

7. The method according to claim 5, wherein said first etching resistant layer-coating apparatus further comprises a doctor blade disposed over said gravure roll, and any excessive volume of said etching resistant liquid supplied onto a surface of said gravure roll is wiped away by means of said doctor blade before said etching resistant liquid is applied to said first main surface.

8. The method according to claim 7, wherein a peripheral speed of said gravure roll which constitutes said first etching resistant layer-coating apparatus is 4 to 25 times as high as that of a feeding speed of said metallic thin plate.

9. The method according to claim 5, wherein said first etching resistant layer-coating apparatus is provided with a slit nozzle.

* * * * *